United States Patent [19]

Chu

[11] Patent Number: 5,150,430
[45] Date of Patent: Sep. 22, 1992

[54] LOSSLESS DATA COMPRESSION CIRCUIT AND METHOD

[75] Inventor: Ke-Chiang Chu, Saratoga, Calif.

[73] Assignee: The Board of Trustees of the Leland Stanford Junior University, Stanford, Calif.

[21] Appl. No.: 670,281

[22] Filed: Mar. 15, 1991

[51] Int. Cl.$^5$ .............................................. H03M 7/34
[52] U.S. Cl. ........................................ 382/56; 341/51; 341/67
[58] Field of Search ...................... 382/56; 341/51, 67, 341/95, 106; 358/261.1, 261.4, 261.2

[56] References Cited

U.S. PATENT DOCUMENTS

| | | | |
|---|---|---|---|
| 4,558,302 | 12/1985 | Welch | 341/95 |
| 4,941,193 | 7/1990 | Barnsley et al. | 382/56 |
| 5,001,478 | 3/1991 | Nagy | 341/51 |
| 5,003,307 | 3/1991 | Whiting et al. | 341/51 |
| 5,051,745 | 9/1991 | Katz | 341/51 |

*Primary Examiner*—Leo H. Boudreau
*Assistant Examiner*—Steven P. Klocinski
*Attorney, Agent, or Firm*—Flehr, Hohbach, Test, Albritton & Herbert

[57] ABSTRACT

A lossless data compression circuit compares a new data string with a set of comparison data, and produces a sequence of codewords representing a sequence of successive, non-overlapping substrings of the new data string. A shift register stores and shifts the comparison data until all of the characters in the comparison data have been compared with the new data string. A composite reproduction length circuit finds the maximum length string within the set of comparison characters matching substrings of characters in the new data string beginning at each position in the new data string. The composite reproduction length circuit produces a multiplicity of data pairs, one for each position of the new data string. Each data pair comprises a maximum length value, corresponding to the maximum length matching comparison string found for the new data substring starting at the corresponding position, and a pointer value denoting where the maximum length matching comparison string is located in the comparison data. A codeword generator then generates a sequence of codewords representing the new data string, each codeword including one of these data pairs and representing a substring of the new data string. By using N such data compression units in parallel, with each storing an identical new data string, and each unit's shift register storing and shifting a different subset of a specified comparison string, processing time for generating codewords is reduced by a factor of approximately $(N-1)/N$.

9 Claims, 6 Drawing Sheets

LOSSLESS DATA COMPRESSION CIRCUIT AND METHOD

The present invention relates generally to data compression systems and circuits and particularly to a circuit and method for performing a number of data compression operations in parallel so as to substantially reduce the computation time required for performing lossless data compression.

BACKGROUND OF THE INVENTION

The term "lossless data compression" means that all of the information in an input string or message is retained when that information is compressed so as to be represented by a smaller amount of data. Thus, when the compressed data is decoded, the reconstructed message will be identical to the original input message represented by the compressed data.

The present invention is, in essence, a highly efficient system and method for implementing a well known lossless data compression technique, sometimes known as the "Lempel and Ziv noiseless universal data compression algorithm". This data compression algorithm is also sometimes called the "history buffer" algorithm.

THE LEMPEL AND ZIV LOSSLESS DATA COMPRESSION METHOD.

Figure 1:
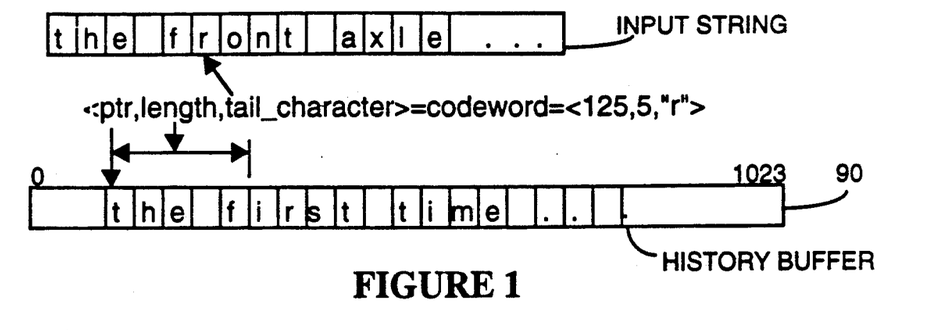
FIG. 1 conceptually depicts how a codeword is generated from an input string and a prefix string.

Referring to FIG. 1, this data compression algorithm works as follows. The data compression unit (or program) stores the last X (e.g., 1024) characters (sometimes called symbols) that have already been encoded in a "history buffer" 90, typically implemented as a circular buffer. When new input data is encoded, the data compression unit looks for the longest string in the history buffer 90 that matches the new input data, beginning with the first character of that new input data. For instance, if the new input data is the string "the front axle of the vehicle snapped when . . . "

the data compression unit would look for the longest matching string beginning with the letters "th . . . ". If the best match found in the history buffer was, say, "the f" (e.g., as part of the phrase "the first time . . . "), then the "reproduction length" of the longest matching string would be five characters: "t", "h", "e", "", and "f". The form of the codeword used to represent the compressed data is as follows:

<pointer, reproduction length, tail character>.

Thus the codeword comprises (1) a pointer to a position in the history buffer where a matching string can be found, (2) the length of the matching string, and (3) a tail character which is the next character in the input string. One reason for including the tail character is to handle cases in which a character is not found in the history buffer. In such cases, the pointer and length fields of the codeword are set equal to "0,0" and the tail character field is equal to the first character of the input string.

Each time that a portion of the input string is converted into a codeword, the input string is shifted so that the beginning of the input string is the first character that has yet to be converted into codeword form. Furthermore, the contents of the history buffer are periodically updated by adding the portions of the input string that have been processed to the end of the history buffer. Since the length of the history buffer is typically constant, adding new data at the end of the buffer usually means that data at the beginning of the buffer is erased or overwritten, unless the history buffer is not yet full. Depending on the particular implementation of the data compression algorithm, the contents of the history buffer may be updated each time that a new codeword is generated, or it may be updated each time that a certain number of input characters have been processed. For instance, the contents of the history buffer may be updated every time that another thirty-two input string characters have been processed by the data compression algorithm.

The net result of the data compression algorithm is that an input string is converted into a sequence of codewords, as described above. To see how this produces data compression, consider the following example. Assume that the history buffer contains 1024 characters, that the maximum allowed reproduction length will be seven, and that it takes eight bits to represent an uncompressed character. The length of each codeword will be:

| 10 bits | Pointer to history buffer position |
| --- | --- |
| 3 bits | Reproduction length value |
| 8 bits | Tail character |
| 21 bits | length of each codeword |

If, on average, each codeword has a reproduction length of four characters, each codeword will represent a total of five characters, including the tail character. Thus, on average, it will take 21 bits to represent five characters instead of 40 bits, representing a compression ratio of about two to one (2:1).

DECODING COMPRESSED DATA

Data decoding, which is the process of converting the codewords back into regular character strings, is very easy. The data decoding unit or program maintains a history buffer that is identical to the one maintained by the data compression unit, updating the contents of the history buffer with newly decoded characters. Each codeword is decoded simply by using the pointer in the codeword to locate a position in its history buffer. Then the specified number of characters in the history buffer are copied, following by the specified tail character, to regenerate the string represented by the codeword. Data decoding is very fast and uncomplicated.

Note that we have not specified the contents of the history buffer when one first begins to compress or decompress data. This is a peripheral issue not relevant to the present invention, but is addressed here to enhance the reader's understanding of the compression method. There are at least two standard methods of dealing with what to put in the history buffer at the beginning of the process: (1) initially clear the history buffer (e.g., fill it with null characters), or (2) always initially fill the history buffer in both the data compression unit and in the data decoding unit with a predefined set of data that is known to produce reasonably good data compression with a wide variety of input data. The first solution results in a lower data compression ratio when small sets of data are compressed, while the second requires a certain amount of coordination between the data compression and data decoding units. Either solution, or any other such solution, can be used in conjunction with the present invention.

As will be understood by those skilled in the art, there is a set of tradeoffs between the length of history buffer, the maximum allowed reproduction length, the compression ratio and the amount of processing time required to perform the data compression. In particular, if the history buffer is made longer (say to 4096 characters), the chances of finding good matching strings increase, and the average reproduction length will increase. However, this will also increase the length of each codeword, because more bits will be required to represent positions in the history buffer, and it will take more processing time to perform the compression because it will take longer to find the best matching string in a larger history buffer.

PROCESSING TIME FOR DATA COMPRESSION

The present invention is primarily concerned with the problem that compressing data using the Lempel and Ziv is very time consuming. As will be explained next using some numerical examples, the Lempel and Ziv data compression method has been used in a number of contexts in which the speed at which data compression is accomplished is not critical, such as transmitting data over telephone lines using standard medium speed modems. The Lempel and Ziv data compression method has generally not been used in high speed applications, such as data storage on hard disks, because the amount of time required for data compression prior to storage on disk has been assumed to be excessive.

Consider the following example of the processing time required to compress data for transmission over a 2400 baud (i.e., 2400 bits per second) transmission line, which is typical of modem transmission used by desktop computers. What we are computing in this example is the number of instructions per second that would have to be executed by a software data compression program in order to keep up with a 2400 baud modem. We will assume a data compression ratio of two to one, meaning that 4800 bits of data, or about 600 characters must be encoded for transmission each second. Also assume a history buffer of 1024 characters, and that the average codeword represents five characters. Since the average codeword represents five characters, the compression unit must generate about 120 codewords per second. To generate a codeword, the compression unit must try to match an input string with strings of characters in the 1024 character history buffer. A ballpark figure for performing this would be about 10,000 instructions: about four instructions for performing each character to character comparison, with an average of about 1.5 to 2.0 such comparisons being required for each character in the history buffer, plus a small number of instructions required to keep track of the best match and to construct the codeword.

Thus the number of executed instructions required to generate the 120 codewords needed on average each second would be about: 120×10,000 or about 1.2 million instructions per second, requiring a computer capable of at least 1.2 MIPS. Using an average of three or four computer clock cycles per instruction, 1.2 MIPS is equivalent to a CPU cycle rate of about 4 or 5 megahertz (i.e., 4 or 5 million computer clock cycles per second). This is well within the capabilities of many desktop computers, with the fastest desktop computers in 1990 having CPU cycle rates of approximately 40 megahertz. In comparison, data decoding requires only about a hundred instructions per codeword, and thus is extremely fast.

Next, we consider the processing requirements for using the Lempel and Ziv data compression method for storing and retrieving data to and from a hard disk or a comparable medium in a computer system. The idea here is that if data compression can be used with such hard disks, then one could approximately double the amount of data stored on any hard disk.

The hard disks used in desktop computers, as of the end 1990, can store up to about 1 million characters per second. High performance hard disks used with more expensive computer systems can store up to about 3.5 million characters per second, but we will use a data storage rate of 1 million characters per second for the purposes of this example. Using a data compression scheme with a two to one compression ratio, the rate of data storage would be about 2 million characters per second, or about 400,000 codewords per second (using an average of five characters per codeword). In order to avoid slowing down the rate of data storage to disk, data compression would need to be accomplished about 3300 times faster than in the above 2400 baud modem example. Thus, performing "seamless" data compression for hard disk storage without impacting on a computer's data storage performance is much, much more challenging. Furthermore, it is clear that such data compression cannot be accomplished with software, since it would require that the computer's processor have a CPU cycle rate on the order of 10 gigahertz.

The present invention provides a data compression circuit using parallel processing techniques which is sufficient fast that it can keep up with the data storage rates of current hard disks. That is, using a 40 megahertz clock rate and the current invention, one can compress two million bytes or characters per second into the codewords associated with the Lempel and Ziv lossless data compression method.

It is noted that there is always a trade-off between implementation feasibility, or processing complexity, of a data compression system and compression ratio. The present invention provides data compression apparatus that is feasible for high speed, using a simple, hardware implementation.

SUMMARY OF THE INVENTION

In summary, the present invention is a lossless data compression circuit which produces a sequence of codewords representing a sequence of successive, non-overlapping substrings of a specified set of data. A first shift register stores a new input string, while a second shift register stores and shifts a prefix string until all of the characters in the prefix string data have been compared with the new data string.

A composite reproduction length circuit finds the maximum length strings within the prefix string which match substrings of characters in the new data string beginning at each position in the new data string. The composite reproduction length circuit produces a multiplicity of data pairs, one for each position of the new data string. Each data pair comprises a maximum length value, corresponding to the maximum length matching prefix string found for the new data substring starting at the corresponding position, and a pointer value denoting where the maximum length matching string is located in the prefix string. A codeword generator then generates a sequence of codewords representing the new data string, each codeword including one of these data pairs and representing a substring of the new data string.

In the preferred embodiment, the composite reproduction length circuit has the following components. A reproduction length register stores a separate length value corresponding to each position of the new data string, and a pointer register stores a separate pointer value corresponding to each position of the new data string. A counter generates a pointer value denoting which subset of the prefix characters are currently stored in the shift register. A modified tallying circuit generates a tally value for each position in the new data string, each tally value representing how many consecutive prefix characters in the shift register, up to a predefined maximum value, match characters in the new data string beginning at a corresponding position in the new data string. Finally, a decoder compares each tally value with a corresponding one of the length values stored in the reproduction length register, and when the tally value exceeds the corresponding stored length value, it replaces the stored corresponding length value with the tally value and replaces the corresponding pointer value stored in the pointer register with the pointer value generated by the counter.

By using N such data compression units in parallel, with each storing an identical new data string, and each unit's shift register storing and shifting a different subset of a specified prefix string, processing time for generating codewords is reduced by a factor of $(N-1)/N$ (e.g., using three parallel data compression units would reduce processing time by a factor of approximately $\frac{2}{3}$).

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 2:
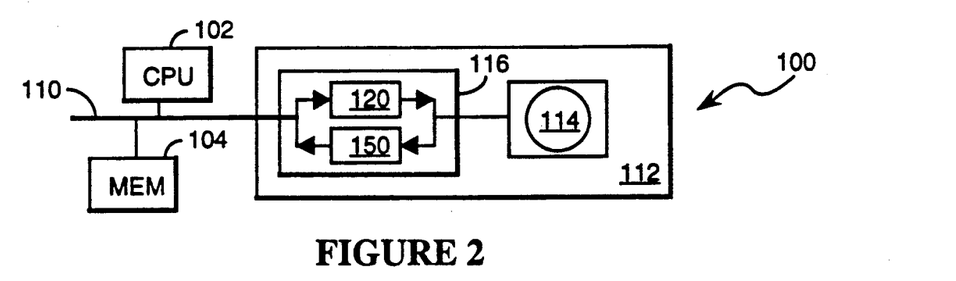
FIG. 2 is a conceptual diagram of a computer system incorporating the lossless data compression and data decoding circuits of the present invention in the data path between a hard disk storage system and the computer system's internal bus.

Referring to FIG. 2, we show a typical computer system 100 in which the present invention can be used. The computer system 100 includes a CPU 102, memory module 104, an internal bus 110, and a hard disk storage system 112 which stores data on a hard disk 114. In the preferred embodiment, data being written to the hard disk 114 are processed by a data encoding circuit 120 and data being retrieved from the hard disk are processed by a data decoding circuit 150. In the preferred embodiment, both the encoder 120 and decoder 150 are implemented on a single, integrated circuit 116. The combined encoder/decoder circuit 116 is used in the data path between a computer's internal bus 110 and its hard disk storage system 112, causing data stored on hard disk 114 to be automatically encoded and compressed as it is being written to the hard disk 114, and to be automatically decoded as it is retrieved. If the encoder circuit 120 is sufficiently fast at performing the necessary encoding operations, the use of the data compression and decoding circuits will be "seamless", in that their presence would not affect the performance of the computer system 100, except that the amount of data that could be stored on the hard disk 114 would be approximately doubled (assuming a compression ratio of 2:1).

Figure 3:
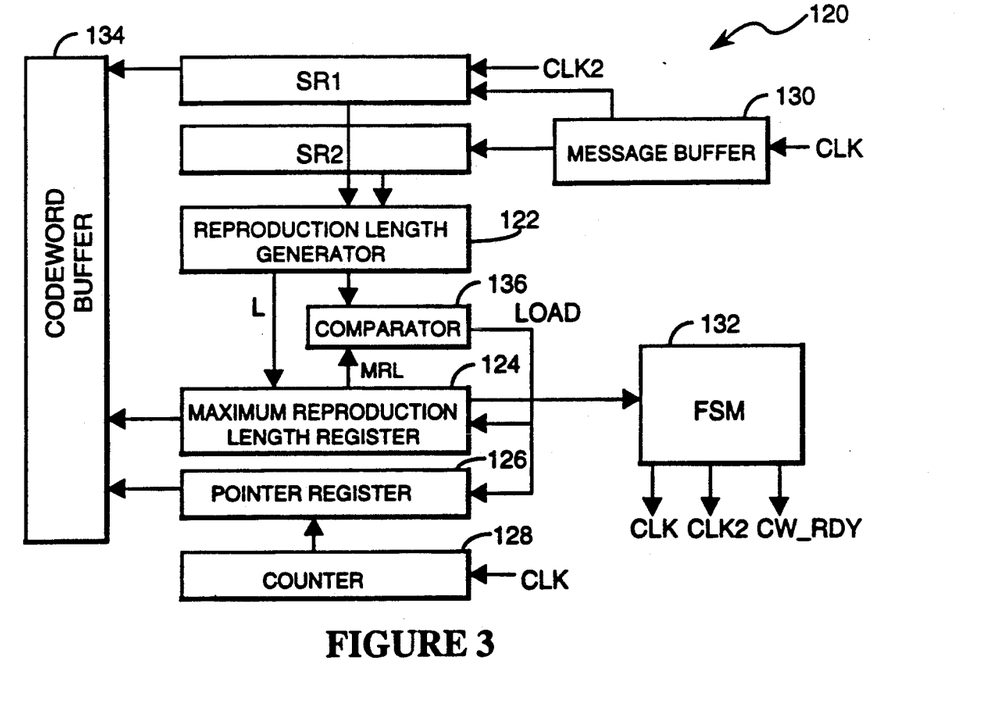
FIG. 3 is a block diagram of a simple hardware circuit for lossless data compression.

Referring to FIG. 3, we will first describe a very simple hardware implementation of a data compression circuit 120 for performing the Lempel and Ziv lossless data compression algorithm. The first data encoding circuit 120 is approximately thirty times faster than a comparable software data compression program. Later, we will show a data compression circuit which is faster than this first circuit, on average, by a factor of ten. This means that, on average, the improved circuit reduces the number of clock cycles required to produce the same codewords by about a factor of ten. As will also be described below, the speed of data compression can be further increased by an additional factor of four to ten, if one is willing to use a commensurate amount of additional circuitry.

The term "character" as used in this document is defined to mean any symbol or other form of data which occupies a predefined amount of storage space (i.e., a predefined number of bits), such as a byte or "word".

In the following description, the string of characters that is being compressed is represented by the letter S. The string S contains characters at positions beginning at position 0 and continuing to position $N-1$, where N is the length of the string. A substring of S which starts at position i and ends at position j is denoted as $S(i,j)$. For convenience, the string currently stored in the history buffer is labelled H, and substrings in the history buffer are denoted $H(i,j)$, where i and j are the beginning and ending positions of the substring in the history buffer. The contents of the history buffer are sometimes called a proper prefix of the string which is currently being processed for data compression.

Given a string S, the reproduction length of the string S at position i is the largest integer $L_i$ such that $$S(i,i+L_i-1)=H(k,k+L_i-1)$$

where H represents the contents of the history buffer and k is any position within the history buffer. The position $P_i$ in the history buffer corresponds to the maximum value of the reproduction length $L_i$ at position i.

Let $S = s_1 s_2 \ldots$ be the string of source symbols that is being compressed. The sequential encoding of S parses S into successive source words, $S = S_1 S_2 \ldots$. For each source word $S_i$, the encoder looks for the longest reproduction length $L_i$, and assigns a codeword $C_i$:

$$C_i = <P_i, L_i, T_i>$$

where $T_i$ is the last symbol of $S_i$. To ensure that all codewords have the same number of bits, a maximum value Lmax is imposed on the reproduction length, typically 7 or 15.

The core of the Lempel-Ziv encoder shown in FIG. 3, is implemented with two shift registers, SR1 and SR2, a reproduction length generator (RLG) 122, maximum reproduction length and pointer latches 124 and 126, and a counter 128. In addition, a memory circuit or message buffer 130 is used to store the data that is being compressed, a finite state machine (FSM) 132 controls the sequence of steps performed by the entire circuit 120, and a codeword buffer 134 is used to temporarily hold portions of the codewords generated by the circuit 120. The FSM 132 generates the two clock signals CLK and CLK2 which control the shift registers SR1 and SR2, and also generates a signal CW_RDY whenever a new codeword has been generated.

Both shift registers SR1 and SR2 are of the same length. In particular, they both store a number of characters which is equal to the maximum allowed reproduction length. For specificity, we will assume that both SR1 and SR2 store seven characters at any one time.

Shift register SR1 stores the substring to be parsed. After SR1 is initially loaded with data, the contents of SR1 are shifted only after the generation of each codeword. As SR1 is shifted, new data is loaded into the shift register from the message buffer 130. In particular, if a codeword with a reproduction length of L is generated, SR1 is shifted L+1 times using clock signal CLK2. The last character shifted out of SR1 is held in the codeword buffer 134 as the tail character of the codeword.

At the beginning of each codeword generation cycle, the contents of registers 124 and 126 are cleared, i.e., set to zero. In addition, the counter 128 is also reset to a predefined beginning value, such as zero. Then the history buffer contents, also called the proper prefix substring, is shifted through SR2 using clock signal CLK. Lmax−1 clock cycles are required to preload SR2, where Lmax is the maximum allowed reproduction length, and is also the number of characters positions in SR1 and SR2. Then, each time that SR2 shifts, the reproduction length generator 122 compares the contents of SR1 and SR2, and generates a reproduction length value L. Comparator 136 compares the current reproduction length value L with the current value MRL stored in the maximum reproduction length register 124. If the current reproduction length value L is greater than MRL, the comparator 136 generates a LOAD signal, which causes the current reproduction length value L to be stored in register 124, and also causes the current pointer value generated by counter 128 to be stored in pointer register 126.

After the proper prefix substring has completely shifted through SR2, the codeword can be generated from the contents of MRL register 124 and pointer register 126, followed by the appropriate tail symbol.

The encoding procedure can be formally described as follows.

1. Initially, SR2 is reset to be 0. SR1 stores the string to be parsed.
2. The history buffer string is shifted into SR2 sequentially, at the rate of one symbol per clock cycle. RLG 122 compares SR1 against SR2 at each clock cycle. A reproduction length L is generated. At the end of every clock cycle, the contents of MRL and pointer registers 124 and 126 are updated, if necessary.
3. After N clock cycles, where N is the length of the history buffer string, a codeword $C_i$ is generated, $C_i = <P_i, L_i, T_i>$.
4. To update the contents of SR1, the symbols occupying the first $L_i + 1$ positions are shifted out, while $L_i + 1$ new source symbols are shifted in. Go back to step 1, and repeat the procedure until the end of the string to be parsed is reached.

In the preferred embodiment, during the first CLK2 cycle during which old symbols are shifted out of SR1 and new symbols are shifted in, the contents of the MRL and pointer registers 124 and 126 are latched into the codeword buffer 134, and simultaneously these registers are cleared. At the same time, the contents of SR2 are also cleared. Thus, no additional clock cycles are required for codeword generation. Codewords are generated, and registers are cleared for the new codeword generation cycle, simultaneously with the shifting in of new symbols into the SR1 register. Using a history buffer of 1024 symbols, and data registers SR1 and SR2 of length Lmax, it will take 1024 + Lmax − 1 + LC clock cycles to generate a codeword which represents LC symbols, as well as to prepare for generating the next codeword.

Assuming that codewords, on the average, each represent five symbols, the data compression circuit of FIG. 3 requires about 206 clock cycles per character to compress a set of data. As a result, a computer system with a 40 megahertz clock rate could compress data using this circuit at a rate of about 200,000 characters or symbols per second. This is about a factor of ten slower than the rate of processing required for seamless processing of data being stored to a hard disk at a rate of one million bytes per second, which is equivalent to about two million symbols per second for a system with a two to one compression ratio.

The data compression circuits described below with reference to FIGS. 5 through 11 overcome the failure of the circuit of FIG. 3 to encode data with sufficient speed. First, however, we describe a compressed data decoder circuit, which while simple, is more than sufficiently fast to keep up with even the fastest hard disk systems.

COMPRESSED DATA DECODER

Figure 4:
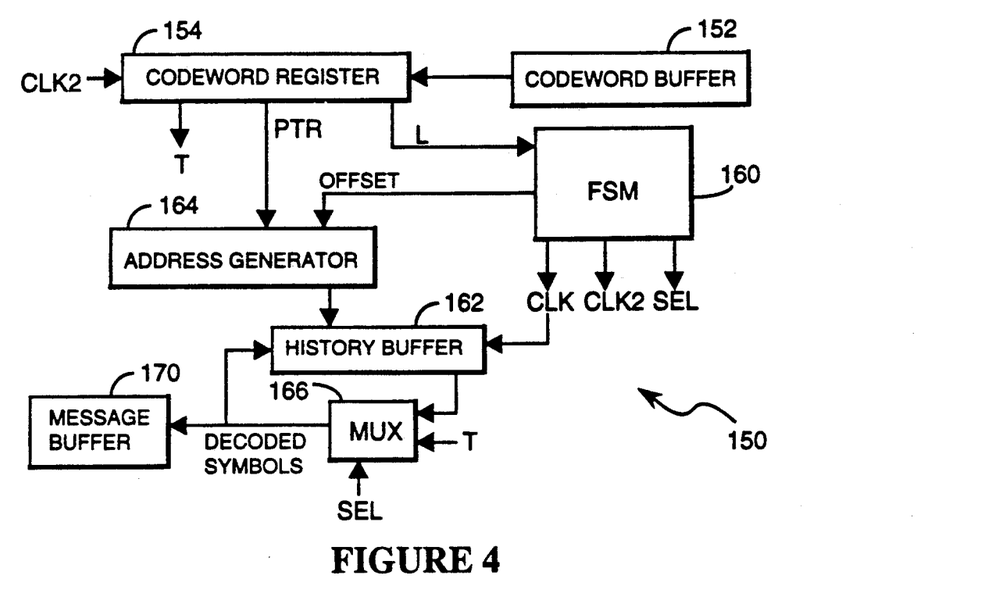
FIG. 4 is a block diagram of a circuit for decoding compressed data generated using the circuit of FIG. 3.

Referring to FIG. 4, the compressed data decoder circuit 150 temporarily stores received codewords in a buffer 152, which are then loaded into codeword register 154 using clock CLK2, which is generated by finite state machine (FSM) 160 each time the decoder circuit 150 is ready to process the next codeword. The current contents of the history buffer or prefix string are stored in buffer 162, which is typically a memory circuit used as circular buffer. The FSM 160 keeps track of the current position of the beginning of the prefix string within the message buffer 162, and generates a corresponding OFFSET value that is added by address generator circuit 164 to the pointer value PTR from the codeword being decoded. The resulting address is the address of the first character of the substring represented by the codeword. The OFFSET value is then incremented by the FSM 160 L times, where L is the reproduction value from the codeword being decoded, during each new CLK clock cycle, until the decoding of a new codeword begins.

After the initial CLK2 signal used to load a codeword into register 154, the FSM generates L+1 clock signals CLK, is the reproduction length value obtained from the codeword being decoded. At each CLK signal, a new decoded symbol is generated. The new decoded symbol is read from the output of a multiplexer 166, which outputs either (1) the tail character T from the codeword being decoded, or (2) the symbol read from the message buffer 162 at the address generated by address generator 164. These decoded symbols are then stored at the appropriate position in the history buffer 162, as well as in an output message buffer 170. Depending on how the history buffer 162 is designed, the reading of a decoded symbol from one address and the storage of that symbol back into the history buffer at a different address can be accomplished in either one or two clock cycles. By using a history buffer that stores, say, 1024 bytes, but limiting the length of prefix string to say, 1020 or 1023 bytes, one of ordinary skill in the art can design a dual ported memory buffer 162 that allows both the reading and storage of decoded symbols from the history buffer to be accomplished in a single clock cycle, with the storage of each symbol occurring one clock cycle after it has been read. In other embodiments of the decoder circuit 150, the history buffer 162 may be updated less frequently, such as only after a predefined number of characters have been decoded.

The FSM 160 keeps track of how many decoded symbols have been read, and when it is time for the tail character to be stored in the history and message buffers 162 and 170, the FSM 160 enables the SEL signal. At the same clock cycle used to store the tail character in the history and message buffers, the next codeword is latched into register 154. Thus, the decoder circuit 150 can process one decoded symbol per clock cycle. Even for medium speed desktop computers, with CPU speeds in the range of 10 to 20 megahertz, this rate of decoding is far faster than the rate at which data can be retrieved from currently available hard disks (approximately one million bytes per second). Thus, even the simple compressed data decoder 150 of FIG. 4 is sufficient to ensure that the data decoding process has no impact on the operating speed of the computer system in which it is used.

DATA ENCODER WITH PARALLEL REPRODUCTION LENGTH GENERATORS

Figure 5:
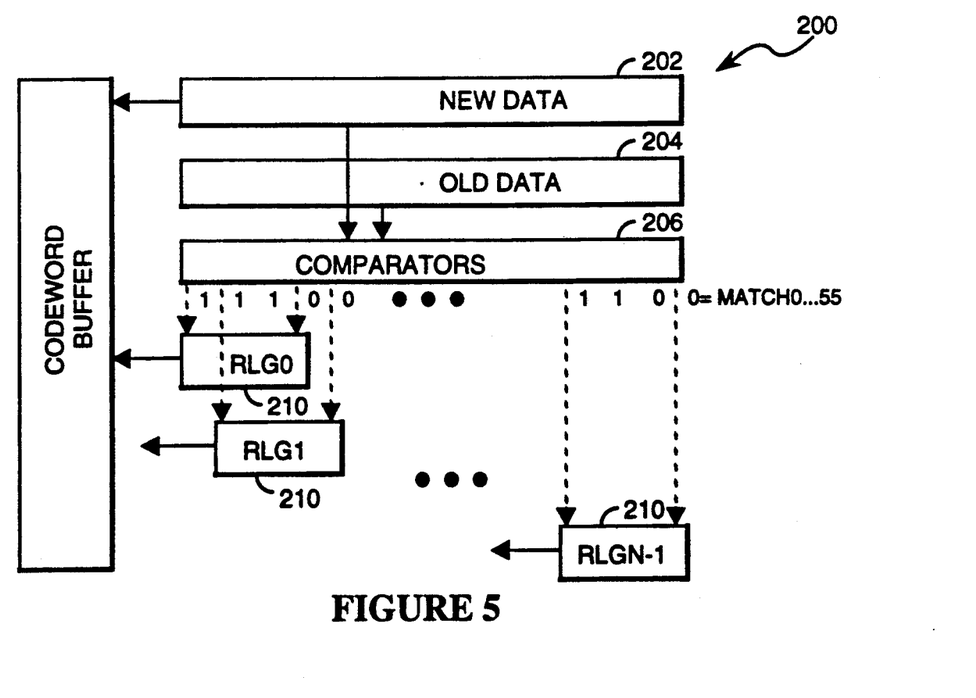
FIG. 5 is a conceptual diagram of a high speed lossless data compression circuit which speeds data compression using one type of parallel data processing.

Referring to FIG. 5, the improved data encoder 200 is implemented with two shift registers 202 and 204, which are longer than the ones used in the simple encoder of FIG. 3. In the preferred embodiment, each shift register now holds fifty-six characters, although the maximum reproduction length Lmax allowed for any single codeword remains seven. As before, any maximum reproduction length value can be used, but seven and fifteen are typically the best values. The first shift register 202 stores the data to be encoded, while the prefix or history buffer data is shifted through the second shift register 204. Also, as with the first encoder, when the new data shift register 202 is shifted, new data is loaded into the shift register.

A set of fifty-six comparators 206 compares the contents of the two shift registers, producing a set of fifty-six match values MATCH0 through MATCH55. Then, at least conceptually, the encoder 200 has fifty reproduction length generators 210 labelled RLG0 through RLG49. Each reproduction length generator 210 accumulates a pair of data values, comprising a maximum reproduction length and a corresponding history buffer pointer value, for a string of new data beginning at a corresponding position in the new data shift register 202.

When all the history buffer data has been compared with the new data, a multiplicity of codewords are generated using the data pairs accumulated by the fifty reproduction length generators 210. Note that the number of characters in each shift register 202, 204 is equal to the number of RLGs 210 plus the maximum reproduction length value (e.g., 7), minus one.

The first codeword generated by the encoder 200 corresponds to the contents of the first reproduction length generator, plus a tail character. This first codeword represents a substring of L+1 characters of the new data in register 202, where L is the reproduction length for the best matching substring in the history buffer data. The next codeword is generated by using the data pair from reproduction length generator L+2. That is, each new codeword is generated using the length and pointer values corresponding to the first character position in the new data register 202 which is not represented by the previously generated codewords. This process continues until all the characters in the new data register 202 are represented by codewords. Then a new set of data is encoded.

It may be noted that the preferred embodiment of the improved data encoder 200 has been sized, in terms of the amount of parallel processing performed, so as to perform data encoding about ten times faster than the data encoder 120 of FIG. 3. In particular, this encoder circuit will use between 1130 and 1137 clock cycles to produce a set of codewords representing between fifty and fifty-seven input data characters. Thus this circuit 200 requires, on average, about 21.4 clock cycles per character to compress a set of data, which is about ten times faster than the circuit of FIG. 3 which required about 206 clock cycles per encoded character. Using a clock rate of 40 megahertz, the encoder circuit 200 can encode about 1.87 million characters per second, which is about what is required for keeping up with a fast hard disk storage system.

It should be noted that the compression ratio will vary depending on the type of data being encoded, which will in turn affect the amount of codeword data generated and thus the rate at which encoded data is presented to the hard disk system for storage. Typically, the compression ratio for text documents and software source code files is a little better than 2.0 to 1, but the compression ratio varies from one set of data to another. The number of parallel "reproduction length generator" circuits 210 used in any particular implementation of the present invention will depend on the speed requirements of the system in which the encoder will be used, and perhaps on the "worst-case" compression ratio situations that one expects to encounter.

The encoder 200 of FIG. 5 will now be described in detail with reference to FIGS. 6 through 10.

Figure 6:
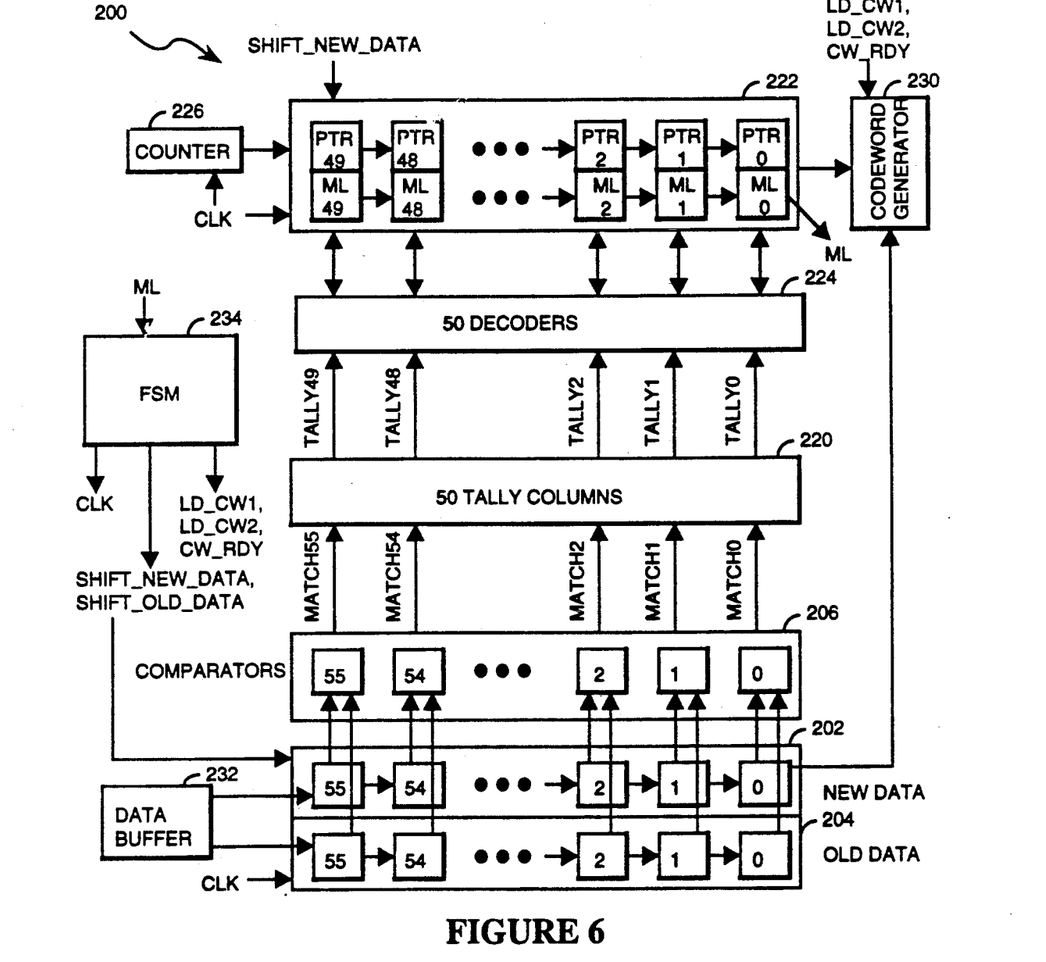
FIG. 6 is a block diagram of a preferred embodiment of a high speed lossless data compression circuit using the first type of parallel data processing.

Referring to FIG. 6, there is shown a block diagram of all the main components of the encoder 200. Going generally from the bottom of FIG. 6 to the top, and from left to right, we have the new data and prefix or "old" data shift registers 202, 204, each of which holds fifty-six characters. Then we have fifty-six comparators 206 which compare each character in the new data register 202 with the corresponding character in the old data register 204. The resulting match signals MATCH0 through MATCH55 are sent to a modified tally circuit 220 which generates a reproduction length value TALLY0-TALLY49 corresponding to each of the first fifty positions in the new data register 202. In particular, each reproduction length value TALLYx represents the number of consecutive characters in the old data register 204 which match corresponding characters in the new data register 202 beginning at a position x in the new data register 202. The modified tally circuit 220 will be described below with reference to FIGS. 8A and 8B.

Next, a set of one hundred latches 222 store fifty data pairs PTR0, ML0 through PTR49, ML49. Each data pair stores the maximum reproduction length MLx found for a corresponding position in the new data register 202, and a corresponding pointer value PTRx.

A set of fifty decoders 224 compares, at each clock cycle, each current tally value TALLYx with a corresponding maximum reproduction length value MLx. If the current tally value is greater than the previously stored maximum reproduction length value, the decoder 224 updates the corresponding data pair using the new tally value and the pointer value generated by a counter circuit 226. The decoder circuit is described in more detail below with reference to FIG. 9.

It should be noted that the latches 222 are interconnected so as to form two shift registers, one for maximum reproduction length values MLx, one for pointer values PTRx. During the codeword phase of operation, after all the prefix data has been processed, the data in these two shift registers is shifted into a codeword generation circuit 230, which generates a sequence of codewords from the accumulated data in the latches 222. The codeword generator circuit 230 is described in more detail below with reference to FIG. 10.

In addition, a data buffer 232 is used to store the data that is being compressed, as well as the prefix data that is compared with the data being encoded. A finite state machine (FSM) 234 controls the sequence of steps performed by the entire circuit 200. The FSM 234 generates a master clock signal CLK, two shift control signals SHIFT_NEW_DATA and SHIFT_OLD_DATA, which control when data is shifted in the new and old data registers 202, 204, and also generates a set of signals LD_CW1, LD_CW2 and CW_RDY for controlling the process of generating codewords.

Figure 7:
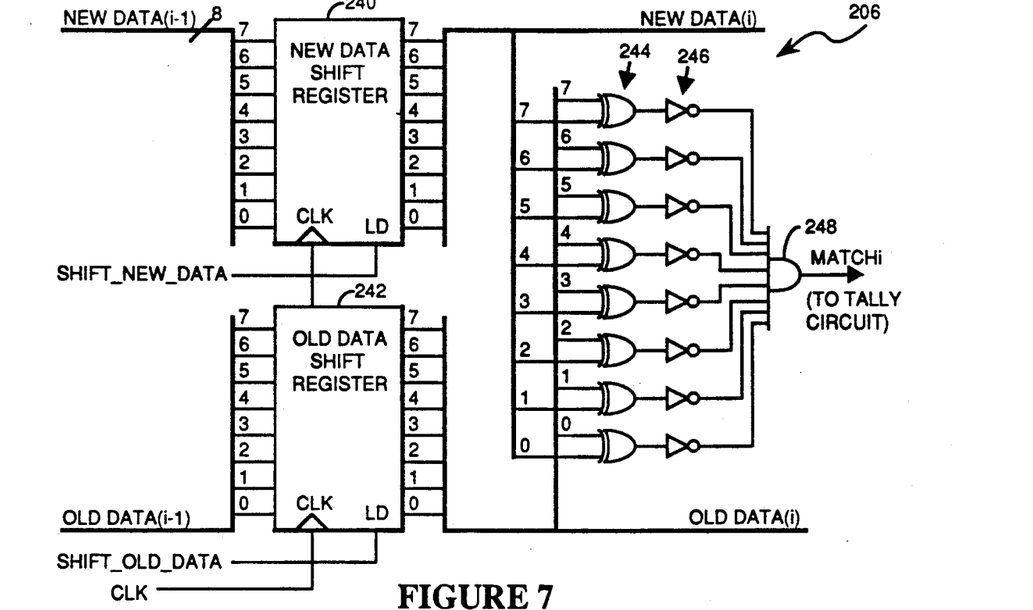
FIG. 7 is a block diagram of a data comparison circuit.

Referring to FIG. 7, there is shown one of the fifty-six character comparator circuits 206. Register 240 stores one eight-bit character of data NEW DATA(i) in the new data shift register 202, and register 242 stores one eight-bit character of data OLD DATA(i) in the old data shift register 204. As shown, register 240 receives input data NEW DATA(i−1) from the prior new data register, and is shifted by the master clock CLK when SHIFT_NEW_DATA is enabled. Register 242 receives input data OLD DATA(i−1) from the prior old data register, and is shifted by the master clock CLK when SHIFT_OLD_DATA is enabled. The first registers 240 and 242 in the new data shift register chain 202 and in the old data shift register chain 204 receive data from the data buffer 232.

A set of eight XOR gates 244 compares each bit of the new data character with a corresponding bit of the old data character. If the two characters are identical, all eight bits will match, and the XOR gates 244 will all output a "0". Otherwise, at least one XOR gate will output a "1". The outputs from all the XOR gates 244 are inverted by a set of eight inverters 246, and the resulting signals are then ANDed by AND gate 248 to produce a match signal MATCHi, where i denotes the position of the new data register character being processed. MATCHi equals "1" if and only if the new and old data characters match, and otherwise it equals "0".

Figure 8A:
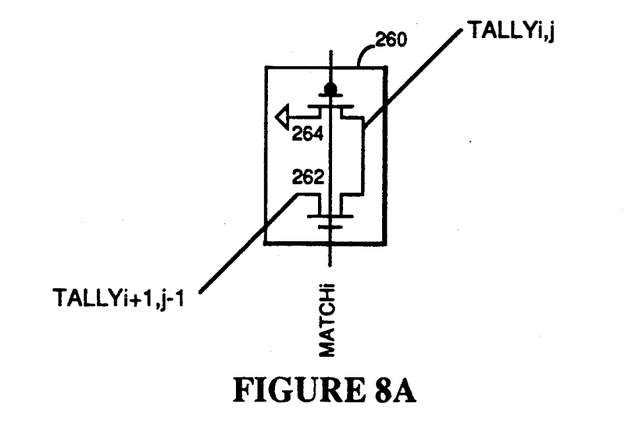
FIGS. 8A and 8B are circuit schematics for a modified tally circuit.
Figure 8B:
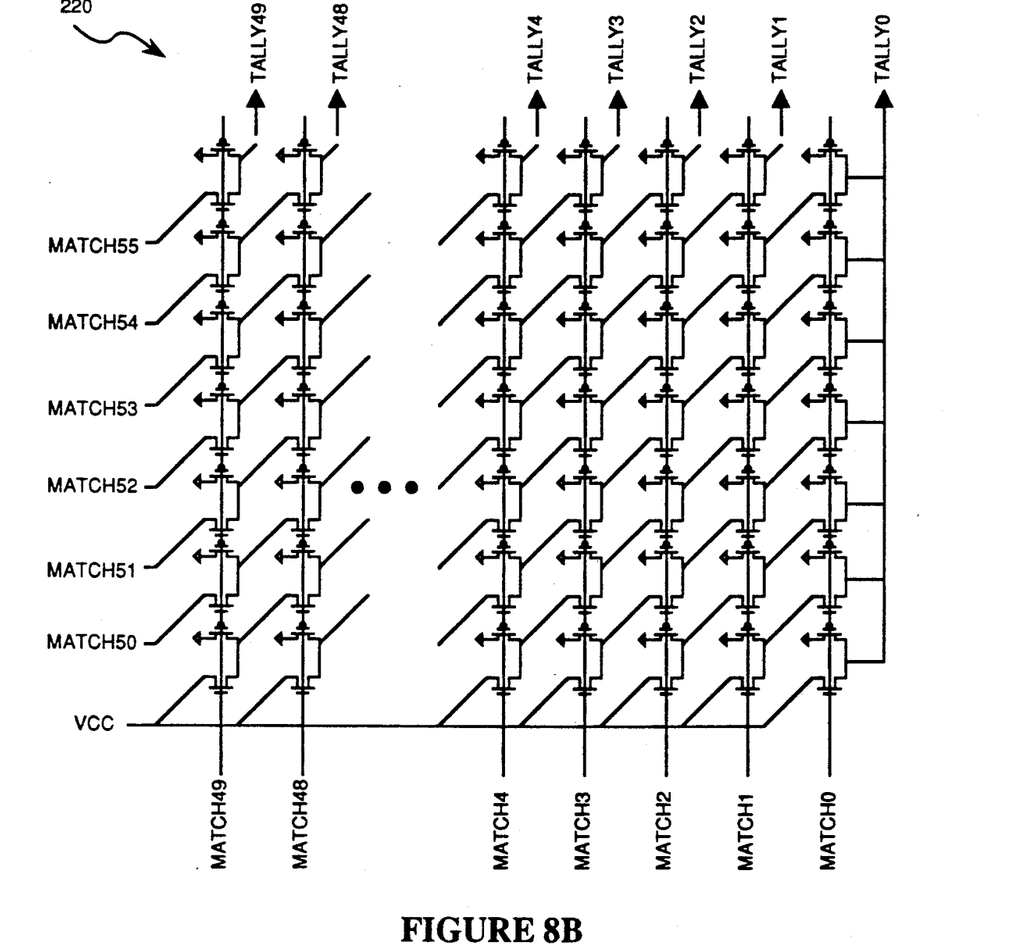

Referring to FIGS. 8A and 8B, the MATCHi signals from the fifty-six comparison circuits 206 are used by modified tally circuit 220 to generate fifty tally values TALLY0 to TALLY49. The tally circuit 220 used in the preferred embodiment is herein called a "modified tally circuit" because it differs somewhat from standard prior art tally circuits. The tally values generated by circuit 220 are encoded in unary format, with a maximum value of seven:

| DECIMAL VALUE | UNARY REPRESENTATION |
| --- | --- |
| 0 | 0000000 |
| 1 | 0000001 |
| 2 | 0000011 |
| 3 | 0000111 |
| 4 | 0001111 |
| 5 | 0011111 |
| 6 | 0111111 |
| 7 | 1111111 |

Thus each of the TALLYi signals has seven bits, represented as TALLYi,j, where i represents the column of the modified tally circuit in which the signal is generated, and j denotes a specific bit of the TALLYi signal.

As shown in FIG. 8A, each cell 260 in the modified tally circuit has an N-channel MOS transistor 262 and a P-channel MOS transistor 264. Both transistors 262-264 are gated by one of the MATCHi signals. If MATCHi is equal to "0", transistor 264 pulls the output of the cell, TALLYi,j, to "0" and transistor 262 is off. If MATCHi is equal to "1", transistor 264 is off and transistor 262 transfers the TALLYi+1,j−1 signal from its source to its drain to generate TALLYi,j. Thus, the cell 260 either (1) replicates the signal TALLYi+1,j−1 at a position one column to the right and one row up if the MATCHi signal is equal to "1", or (2) puts out a value of zero if the MATCHi signal is equal to "0". Thus the value of TALLY3 will be 0000111.

It is easiest to explain the operation of the modified tally circuit 220 by example. Referring to FIG. 8B, lets assume that MATCH4=1 and that TALLY4 is equal to 0000011, which means that the reproduction length of the new data string beginning at position 4 is equal to two. In other words, characters 4 and 5 of the new and old data strings match, but character 6 of the old data string does not match character 6 of the new data string. The "0" bits of TALLY4 are from the cells at the top of the column and the "1" bits are from the two bottom cells of the TALLY4 column.

Next, lets consider the value of TALLY3. If MATCH3=0, then TALLY3 should equal 0 because the reproduction length must equal zero if the first character of the new and old data strings do not match. As can be seen from FIG. 8B, if MATCH3=0, all the tally bits for the TALLY3 column will be equal to 0. If MATCH3=1, the first six bits of the tally value from the TALLY4 column is replicated in the TALLY3 column, shifted upwards by one bit position. In addition, a "1" bit is generated at the lowest bit position, because that cell's input is connected to VCC, the positive voltage power supply for the circuit.

In general, given that the reproduction length output by the r+1-th column of the modified tally circuit is equal to T, and that the maximum allowed reproduction length value is Lmax, then the reproduction length output by the r-th column of the modified tally circuit will be one of three values:

(1) If MATCHr=0, TALLYr=0.
(2) If MATCHr=1, and T<Lmax, then TALLYr=T+1.
(3) If MATCHr=1, and T=Lmax, then TALLYr=Lmax.

The only remaining aspect of the tally circuit 220 to be explained is the left most tally column, TALLY49. In this column, the MATCH49 value is replicated in the lowest bit position. If MATCH49=1, then MATCH50 through MATCH55 are replicated in each of the other bit positions of the TALLY49 column. Otherwise, if MATCH49=0, all the bit positions of TALLY49 are equal to 0. This column of the tally circuit is conceptually equivalent to the reproduction length generator circuit used in a simple encoder, where the reproduction length is generated in unary format. However, in this circuit 220, the first six bits of the each tally column are also used as inputs to the next tally column.

Figure 9:
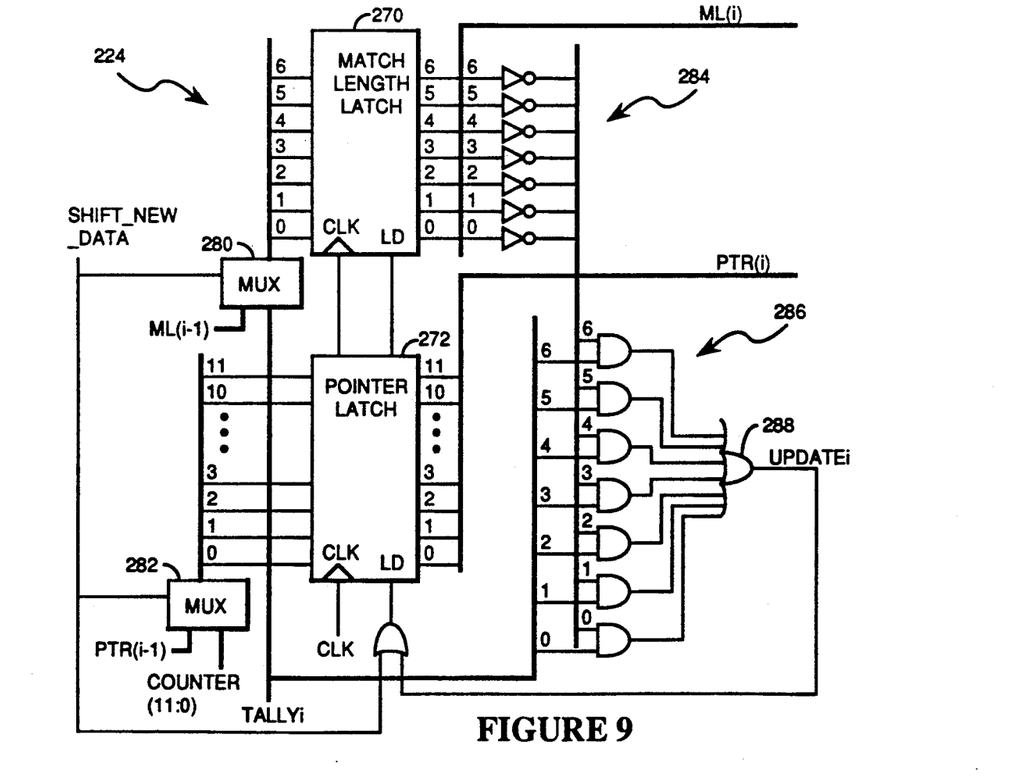
FIG. 9 is a block diagram of a decoder for selecting the longest string in a set of comparison data which matches a specified new data string.

Referring to FIG. 9, each unary format TALLYi signal is processed by one of the fifty decoder circuits 224. Register 270 stores one seven-bit, unary format, match length value ML(i). Register 272 stores one ten-bit pointer value PTR(i). Each of these registers 270, 272 has a corresponding multiplexer 280, 282 which controls what data is stored that register, as selected by the SHIFT_NEW_DATA signal. During the process of comparing the new data with the prefix data, SHIFT_NEW_DATA is disabled, in which case the input data to the match length latch is TALLYi, and the input data to the pointer latch is the counter value.

Seven inverters 284 coupled to the output of the match length latch 270 generate the inverse of the ML(i) value stored in latch 270. These inverted bits are then ANDed with the seven bits of the TALLYi value by seven AND gates 286, and the resulting signals are then ORed by OR gate 288 to generated an UPDATEi signal. If TALLYi is larger than ML(i), then at least one of the AND gates will generate a "1" value, and thus UPDATEi will be equal to "1". If TALLYi is equal to or smaller than ML(i), UPDATEi will be equal to "0".

When UPDATEi is equal to "1", the TALLYi value is stored in latch 270 and the COUNTER value is stored in latch 272 at the beginning of the next master clock CLK cycle. Thus, a new reproduction length data and an associated history buffer pointer value are loaded into latches 270 and 272 whenever a longer prefix string is found.

The purpose of the two multiplexers 280 and 282 is to connect the fifty match length latches 270 into one shift register and to connect the fifty pointer latches 272 into another shift register during codeword generation. In particular, after all the prefix data has been shifted through the old data shift register, SHIFT_NEW_DATA is enabled, and the next fifty or so clock cycles are used to generate codewords and to shift new data into the new data shift register 202. Each time that the characters in the new data shift register 202 are shifted, the contents of the match length latches 270 and the pointer latches 272 are also shifted by one position. As a result, the codeword generation circuit 230 needs to access only the contents of the first match length latch ML0 and the first pointer latch PTR0.

Figure 10:
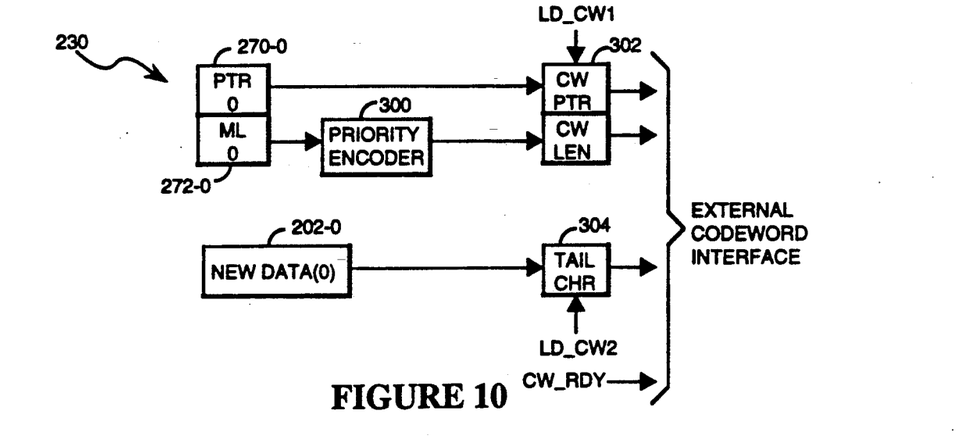
FIG. 10 is a block diagram of codeword generator circuit.

Referring to FIG. 10, before considering the operation of the codeword generator 230, it is useful to consider the sequence of clock and control signals used by the entire encoder 200. Initially, the new data shift register 202 is loaded with fifty six characters of data. The last seven characters of the old data shift register 204, at positions 49 through 55, are loaded with the beginning of the prefix string and all the other positions of the old data register 204 are cleared (filled with null characters). Then the 1024 characters of the prefix string are shifted through the old data shift register 204, which takes 1079 clock cycles, where the number of clock cycles is equal to the length of the prefix string, plus the length of the new data shift register, minus one. During this time SHIFT_OLD_DATA is enabled and SHIFT_NEW_DATA is disabled.

Next, SHIFT_NEW_DATA is enabled. At the next clock cycle codeword generation begins. Codeword generation takes between fifty and fifty seven clock cycles, depending on where the last encoded character corresponding to the last codeword happens to be positioned. Each time that a character of encoded data is shifted out of the new data shift register 202, a new character is shifted in from the data buffer 232. In addition, the PTR and ML "shift registers" are shifted by the same number of positions as the new data shift register, with values of "0" being loaded into the PTR49 and ML49 registers. As a result, each successive codeword is generated from the PTR0 and ML0 values.

The last codeword to be generated uses the PTR and ML values initially stored somewhere between position 43 (for a codeword representing the eight characters between positions 43 and 50) and position 50 (for a codeword representing a substring of one to eight characters beginning at position 50). The FSM 234 keeps track of how many characters have been encoded during any one encoding cycle. When the total number of encoded characters is equal to fifty or more, codeword generation stops, and the next data encoding cycle begins.

Furthermore, during the first clock cycle of codeword generation, the old data shift register 204 is cleared. Prior to encoding the next set of new data, the first six positions (positions 55 through 50) in the old data shift register 204 are loaded with the beginning of the updated prefix string. Depending on how the data buffer 232 is designed, the pre-loading of the old data shift register 204 can either be overlapped with the shifting of the new data shift register 202, or else an additional six clock cycles are required for this pre-loading operation.

Referring to FIG. 10, the codeword generator circuit 230 works as follows. A standard priority encoder circuit 300 is used to convert the unary length value ML0 into binary format. The signal LD_CW1 is used to load ML0 and PTR0 into a first latching buffer 302, and LD_CW2 is used to load a tail character from the last position in the new data shift register 202 into a latching buffer 304. If ML0 is equal to zero, indicating that no matching strings were found in the prefix string, the FSM 234 generates LD_CW1 and LD_CW2 simultaneously. In this case, only the last character in the new data shift register is used to generate a codeword, and the new data shift register 202 is shifted by only one position prior to generating the next codeword.

If ML0 is not equal to zero, the ML0 and PTR0 values from latches 270-0 and 272-0 are loaded into buffer 302 by the LD_CW1 signal, and these values are used to form the first two fields of a codeword. Then the new data shift register 202 is shifted until the tail character for the codeword is in the last position of the shift register 202, whereupon the FSM 234 generates LD_CW2 to load the tail character into buffer 304 and it also generates CW_RDY to indicate that a new codeword is ready.

Referring back to FIG. 6, as additional columns are added to the encoder circuit so as to speed up the rate that data is encoded, the amount of circuitry needed increases more slowly than performance since adding an extra column of circuitry costs very little. For instance, an additional five columns could be added to the encoder circuit 200 so as to decrease the number of clock cycles required to encode each character to less than 20 clock cycles per character.

It is also noted that using a 40 megahertz clock with the encoder requires that the circuit be able to perform the functions for each clock cycle within 25 nanoseconds. The number of gate delays involved is as follows: about two gate delays for latching shifted data, three gate delays for the comparator 206, seven gate delays for the tally circuit 220, and two gate delays for the decoder circuit 224, for a longest signal path with a total of about fourteen gate delays. Using one micron CMOS circuitry, a 25 nanosecond clock cycle rate is quite feasible, since gate delays for such CMOS circuitry tends to be between 0.5 and 1.5 nanoseconds per gate.

Figure 11:
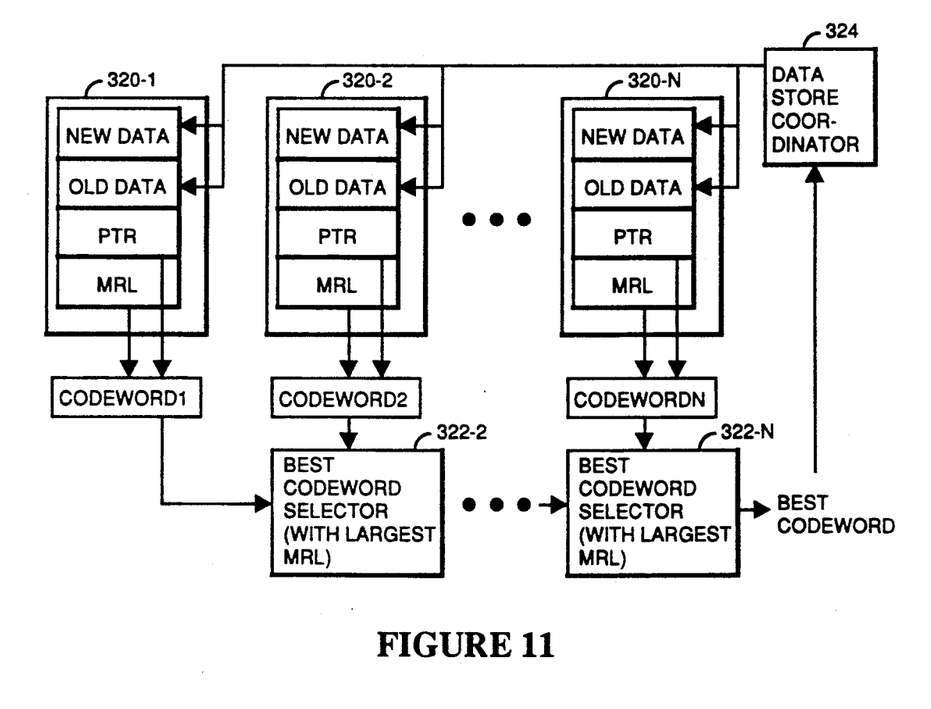
FIG. 11 is a block diagram of a high speed lossless data compression circuit which speeds data compression using a second type of parallel data processing.

Referring to FIG. 11, a second method of improving the speed at which data is encoded is to use N parallel data encoders 320-1 through 320-N. The new data register in each encoder 320 is loaded with the same data string, but each encoder 320 processes a different portion of the prefix string.

Initially, we will assume that each encoder 320 is a simple encoder of the type shown in FIG. 3. After each encoder has processed its portion of the prefix string, each outputs a codeword. Each encoder chip will include an additional "arbitration circuit" 322 for receiving the codeword from another encoder chip and selecting the codeword with the largest reproduction length. If the encoder chips are arranged sequentially as in FIG. 11, the arbitration circuit in the first encoder 320-1 is not used. Each of the other arbitration circuits selects the better of the codeword from its encoder and the received codeword, and passes the result on to the next arbitration circuit, with the last arbitration circuit producing the actual codeword. For systems using more than, say, four encoders 320, a binary tree of codeword selector circuits 322 would be preferable so as to avoid long codeword signal propagation delays.

To use this form of parallel processing, a data storage coordinator circuit 324 is used to divide up the prefix string among the N encoders, and to provide the new data to be encoded for each encoding cycle. To avoid edge effects (i.e., to avoid the possibility of missing the best matching substring in the prefix data), the portions of the prefix string used by the encoders must overlap by Lmax characters, where Lmax is the maximum reproduction length. Thus, if N encoders are used, the length of the prefix string portion used by each encoder 320 will be:

$$\text{length of prefix portion} = \frac{L(\text{prefix}) + (N - 1)L\max}{N}$$

If the prefix is 1024 characters long, Lmax equals seven, and four encoders are used, the length of each encoder's portion of the prefix string will be 262 characters, with the first encoder receiving only 259 prefix string characters.

Using this approach to increasing the speed of data compression encoding, hardware cost increases slightly faster than performance. The increase is slightly more than a factor of N, since we need a circuit which selects the best output from one of N encoders. This approach to parallel data processing has the advantage that it is modular: to increase processing speed, one need only increase the number of chips used. By using N such data compression units, processing time for generating codewords is reduced by a factor of approximately $(N-1)/N$. For example, using three parallel data compression units $(N=3)$ would reduce processing time by a factor of approximately $\frac{2}{3}$. Processing time is actually reduced by a slightly smaller factor due to the need to overlap the portions of the prefix string used by each encoder.

In another embodiment, the individual data compression encoders 320 used in the system of FIG. 11 are the composite encoders 200 shown in FIG. 6. This combines both types of a parallel processing in one data compression system. For instance, the circuit of FIG. 11 could be used to combine two of the composite data encoders of FIG. 6, thereby approximately doubling the rate at which data is encoded. In this embodiment, a multiplicity of codewords would be generated after each prefix string is processed. The data storage coordinator 324 would need to control the process of shifting data in the new data shift registers of the encoders during codeword generation, and would also need to control the codeword generators in each encoder, primarily because the identity of the tail character in each codeword will depend on which encoder has produced the largest reproduction length value. The best codeword selector circuits 322 in this embodiment would be used to select a largest reproduction length value, and then the data storage coordinator 324 would cause all the new data shift registers to shift by the same number of positions until the tail character is reached and added to the end of the codeword.

In yet another embodiment, it would be possible to cascade data compression encoders of the type shown in FIG. 6, so as to increase the effective length of the data shift registers and the length of the comparator, tally, decoder, PTR latch and ML latch circuits. To do this, one must merely provide the necessary physical connections so that the outputs of one chip's registers can be shifted into those of the next encoder chip. This requires a large number of input/output pins, but it is nevertheless possible.

One method of using the parallel processing of FIG. 11, would be to use the normal prefix string as the comparison data in one encoder 320-1, and to using a special set of comparison data, with frequently occurring patterns such as a frequently used dictionary or table in a second parallel encoder 320-2. The encoders would be set up so as to generate non-overlapping sets of pointer values, making it easy to determine the source of the selected best matching substring for each codeword.

It should be noted that the data compression encoders described above are stand-alone hardware modules which can be inserted into a data path. On one side of the module, original source message symbols flow into the module. On the other side of the module, the compressed codewords flow out. Other than speed matching devices, if necessary, no other control circuits, or any other supporting devices are required. As a result, the data compression module can be inserted easily and inexpensively into currently existing systems.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A lossless data compression circuit, comprising:
   new data register means for storing a new data string to be compressed, said new data string containing an ordered sequence of characters stored at corresponding positions in said new data register means;
   shift register means for storing and shifting a set of comparison characters to be compared with said characters stored in said new data register means; said shift register shifting positions of said comparison characters until all of said comparison characters have been shifted through said shift register means;
   comparison means, coupled to said new data register means and said shift register means, for simultaneously comparing all of said characters stored in said new data register means with corresponding ones of said comparison characters stored in said shift register means each time that said comparison characters are shifted in said shift register means;
   composite reproduction length means, coupled to said comparison means, for determining simultaneously, for all positions in at least a contiguous subset of positions in said new data register means, maximum length strings within said set of comparison characters matching substrings of said characters stored in said new data register means beginning at corresponding positions in said new data register means, said composite reproduction length means producing in parallel a multiplicity of data pairs, each data pair corresponding to a different position in said new data register means, each data pair comprising a length value, corresponding to said maximum length string found for a substring beginning at a corresponding position in said new data register means, and a pointer value denoting where said maximum length string is located in said set of comparison characters; and
   codeword generating means, coupled to said composite reproduction length means, for generating a sequence of codewords representing said new data string to be compressed, each said codeword including data corresponding to one of said data pairs and representing a substring of said new data string.

2. A lossless data compression circuit as in claim 1, said composite reproduction length means including:
   reproduction length register means for storing a multiplicity of said length values, each said length value corresponding to a different position in said new data register means;
   pointer means for storing a multiplicity of said pointer values, each said pointer value corresponding to one of said length values in said reproduction length register means;
   counter means for generating a current pointer value denoting which comparison characters are currently stored in said shift register means;
   tallying means for simultaneously generating tally values for all positions in said at least a contiguous subset of positions in said new data register means, each said tally value representing how many consecutive comparison characters stored in said shift register means, up to a predefined maximum value, match said characters stored in said new data register means beginning at a corresponding position in said new data register means; and
   decoder means for simultaneously comparing all of said tally values with corresponding ones of said length values stored in said reproduction length register means, and when any of said tally values exceeds said corresponding stored length value, replacing said stored corresponding length value with said tally value and replacing said corresponding pointer value stored in said pointer means with said current pointer value generated by said counter means.

3. A lossless data compression circuit as in claim 1, said sequence of codewords representing a sequence of successive, non-overlapping substrings of said new data string, said codeword generating means including means for repeatedly selecting a position in said new data register means following a substring represented by a previous codeword generated by said codeword generating means and generating a codeword corresponding to the data pair for said selected position in said new data register means.

4. A lossless data compression circuit, comprising:
(1) a plurality of lossless data compression units, each lossless data compression unit including:
   (a) new data register means for storing a new data string to be compressed, said new data string containing an ordered sequence of characters stored at corresponding positions in said new data register;
   (b) shift register means for storing and shifting a set of comparison characters to be compared with said characters stored in said new data register means; said shift register shifting positions of said comparison characters until all of said comparison characters have been shifted through said shift register means;
   (c) comparison means, coupled to said new data register means and said shift register means, for comparing said characters stored in said new data register means with corresponding ones of said comparison characters stored in said shift register means each time that said comparison characters are shifted in said shift register; and
   (d) reproduction length means, coupled to said comparison means, for determining a maximum length string within said set of comparison characters matching said characters stored in said new data register means, and for generating a data pair comprising a length value, corresponding to said maximum length string, and a pointer value denoting where said maximum length string is located in said set of comparison characters; and (2) codeword generating means, coupled to said reproduction length means in all of said plurality of lossless data compression units, including means for determining which of said length values generated by said plurality of reproduction length means is largest, and for generating a codeword representing a portion of said new data string, said codeword including data corresponding to the one of said data pairs with said largest of said length values;

wherein each said new data register means stores an identical new data string, and each said shift register stores and shifts a different subset of a specified comparison string, whereby when N of said lossless data compression units are used, processing time for generating said codewords is reduced by a factor of approximately $(N-1)/N$.

5. A lossless data compression circuit as in claim 4, each said reproduction length means in each of said plurality of lossless data compression units comprising a composite reproduction length means, coupled to said comparison means, for determining simultaneously, for all positions in at least a contiguous subset of the positions in said new data register means, maximum length strings within said set of comparison characters matching substrings of said characters stored in said new data register means beginning at corresponding positions in said new data register means, said composite reproduction length means producing in parallel a multiplicity of said data pairs, each said data pair corresponding to a different position in said new data register means; and said codeword generating means including means for generating a sequence of codewords representing said new data string to be compressed, said sequence of codewords representing a sequence of successive, non-overlapping substrings of said new data string, said codeword generating means including means for repeatedly selecting a position in said new data string following a substring represented by a previous codeword generated by said codeword generating means, determining a largest length value for the plurality of data pairs corresponding to said selected position in said new data string, and generating a codeword corresponding to the one of said plurality of data pairs with said largest length value.

6. A lossless data compression circuit as in claim 5, said composite reproduction length means in each lossless data compression unit including:

reproduction length register means for storing a multiplicity of said length values, each said length value corresponding to a different position in said new data register means;

pointer means for storing a multiplicity of said pointer values, each said pointer value corresponding to one of said length values in said reproduction length register means;

counter means for generating a current pointer value denoting which comparison characters are currently stored in said shift register means;

tallying means for simultaneously generating tally values for all positions in said at least a contiguous subset of the positions in said new data register means, each said tally value representing how many consecutive comparison characters stored in said shift register means, up to a predefined maximum value, match said characters stored in said new data register means beginning at a corresponding position in said new data register means; and decoder means for simultaneously comparing all of said tally values with corresponding ones of said length values stored in said reproduction length register means, and when any of said tally values exceeds said corresponding stored length value, replacing said stored corresponding length value with said tally value and replacing said corresponding pointer value stored in said pointer means with said current pointer value generated by said counter means.

7. A lossless data compression method, the steps of the method comprising:

storing in a data register a new data string to be compressed, said new data string containing an ordered sequence of characters stored at corresponding positions in said data register;

storing in a shift register a set of comparison characters to be compared with said characters stored in said data register; successively shifting positions of said comparison characters stored in said shift register until all of said comparison characters have been shifted through said shift register;

simultaneously comparing all of said characters stored in said data register with corresponding ones of said comparison characters stored in said shift register each time that said comparison characters are shifted in said shift register;

determining, simultaneously for all positions in at least a contiguous subset of the positions in said data register, maximum length strings within said set of comparison characters matching substrings of said characters stored in said data register beginning at corresponding positions in said data register, and producing in parallel a multiplicity of data pairs, each data pair corresponding to a different position in said data register, each data pair comprising a length value, corresponding to said maximum length string found for a substring beginning at a corresponding position in said data register, and a pointer value denoting where said maximum length string is located in said set of comparison characters; and generating a sequence of codewords representing said new data string to be compressed, each said codeword including data corresponding to one of said data pairs and representing a substring of said new data string.

8. The lossless data compression method of claim 7, said determining step including the steps of:

storing a multiplicity of said length values, each length value corresponding to a different position in said data register;

storing a multiplicity of said pointer values, each pointer value corresponding to one of said stored length values;

generating a current pointer value denoting which comparison characters are currently stored in said shift register;

each time said comparison characters are shifted in said shift register, generating simultaneously current tally values for all positions in said at least a contiguous subset of the positions in said data register, each said current tally value representing how many consecutive comparison characters stored in said shift register, up to a predefined maximum value, match said characters stored in said data register beginning at a corresponding position in said data register; and each time said comparison characters are shifted in said shift register, simultaneously comparing all of said current tally values with corresponding ones of said stored length values, and when any of said current tally values exceeds said corresponding stored length value, replacing said corresponding stored length value with said current tally value and replacing the corresponding stored pointer value with a value corresponding to said current pointer value.

9. The lossless data compression method of claim 7, said sequence of codewords representing a sequence of successive, non-overlapping substrings of said new data string; and said codeword generating step including repeatedly selecting a position in said data register following a substring represented by a previous codeword generated by said codeword generating step and generating a codeword corresponding to the data pair for said selected position in said data register.

* * * * *